(12) United States Patent
Park et al.

(10) Patent No.: US 7,429,511 B2
(45) Date of Patent: Sep. 30, 2008

(54) METHOD OF FORMING A TUNNELING INSULATING LAYER IN NONVOLATILE MEMORY DEVICE

(75) Inventors: Weon-Ho Park, Suwon-si (KR); Tea-Kwang Yu, Suwon-si (KR); Kyoung-Hwan Kim, Hwaseong-si (KR); Kwang-Tae Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 390 days.

(21) Appl. No.: 11/171,706

(22) Filed: Jun. 30, 2005

(65) Prior Publication Data
US 2006/0008985 A1    Jan. 12, 2006

(30) Foreign Application Priority Data
Jul. 6, 2004    (KR)    ...... 10-2004-0052383

(51) Int. Cl.
*H01L 21/336* (2006.01)
(52) U.S. Cl. ......... 438/257; 438/201; 438/211; 257/E21.68
(58) Field of Classification Search ......... 438/201, 438/211, 257–258, 593; 257/E21.422, E21.68, 257/E21.687
See application file for complete search history.

(56) References Cited

U.S. PATENT DOCUMENTS

| | | | |
|---|---|---|---|
| 5,591,658 A | * | 1/1997 | Cacharelis ............ 438/264 |
| 5,817,557 A | | 10/1998 | Baldi ............ 438/264 |
| 6,365,325 B1 | * | 4/2002 | Chiang et al. ............ 430/313 |
| 6,483,145 B1 | * | 11/2002 | Park et al. ............ 257/316 |
| 6,586,301 B2 | | 7/2003 | Orita |
| 2002/0028583 A1 | * | 3/2002 | Ko et al. ............ 438/756 |

FOREIGN PATENT DOCUMENTS

| | | |
|---|---|---|
| CN | 1233075 A | 10/1999 |
| CN | 1434502 A | 8/2003 |
| JP | 63-246875 | 10/1988 |
| JP | 09-063989 | 3/1997 |
| KR | 10-2003-0048215 A | 6/2003 |

OTHER PUBLICATIONS

English Abstract Publication No. CN1233075A.
English Abstract Publication No. CN1434502A.

* cited by examiner

*Primary Examiner*—Thanhha Pham
(74) *Attorney, Agent, or Firm*—F. Chau & Associates, LLC.

(57) ABSTRACT

A method of forming a tunneling insulating layer having a size smaller than the size obtained by the resolution of a photolithography process is provided. The method includes the steps of forming a first insulating layer and a second insulating layer on a substrate, forming a re-flowable material layer pattern to re-flow the re-flowable material layer pattern, removing the second insulating layer and the first insulating layer to expose the substrate, and forming a tunneling insulating layer.

7 Claims, 9 Drawing Sheets

Fig. 1

(PRIOR ART)

Fig. 2

(PRIOR ART)

Fig. 3

(PRIOR ART)

Fig. 4

(PRIOR ART)

Fig. 15

METHOD OF FORMING A TUNNELING INSULATING LAYER IN NONVOLATILE MEMORY DEVICE

CROSS-REFERENCE TO RELATED APPLICATIONS

This patent application claims priority under 35 U.S.C. § 119 to Korean Patent Application 2004-52383 filed on Jul. 6, 2004, the entire contents of which are hereby incorporated by reference.

BACKGROUND OF THE INVENTION

The present invention relates to a method of forming a nonvolatile memory device, and more particularly, to a method of forming a tunneling insulating layer in an electrically erasable and programmable memory device.

As is well known, in an electrically erasable and programmable read only memory (EEPROM) device, charges are injected into a floating gate and are discharged from the floating gate through a thin tunneling insulating layer so that data is programmed and erased. A significant interest in the semiconductor memory device fabrication technology field is to increase the capacity of the memory, which requires reduction in the size of a unit cell.

To reduce the size of a unit cell, the thickness of an intergate insulating layer between a floating gate and a control gate, the area of a tunneling region (a tunneling insulating layer), and/or the thickness of the tunneling insulating layer need to be reduced. When the thickness of the tunneling insulating layer is too small, the leakage current is significant. The tunneling insulating layer cannot be less than a predetermined thickness. Therefore, it is required that the area of the tunneling region be reduced.

A conventional method of forming an EEPROM device is disclosed in Japanese Patent Publication No. sho 63-246875 and in U.S. Pat. No. 5,817,557. FIGS. 1 to 4 describe such a conventional method.

Figure 1:
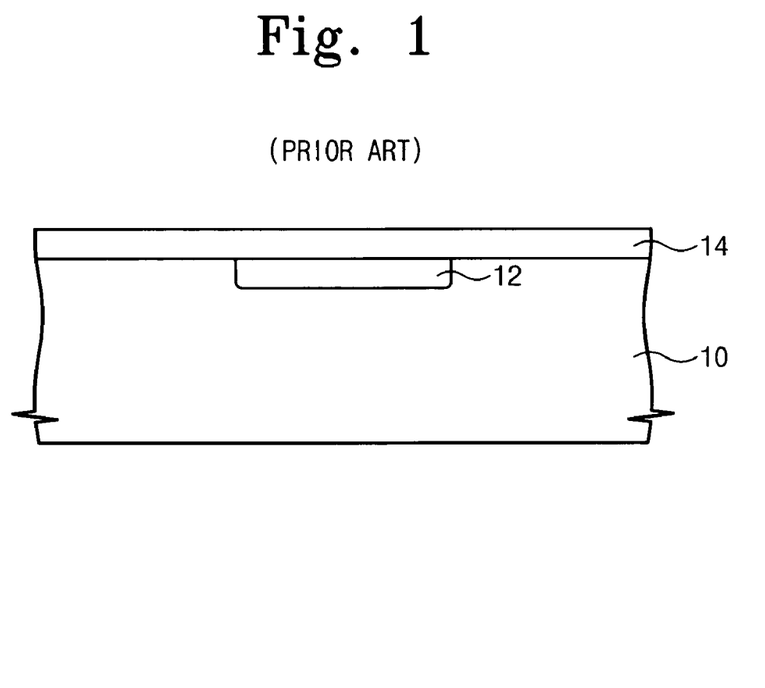
FIGS. 1 to 4 are sectional views of a semiconductor substrate illustrating fabrication processes of a conventional method of forming a tunneling insulating layer in an EEPROM device.

First, referring to FIG. 1, an oxide layer 14 is formed on a semiconductor substrate 10 including an impurity diffusion region 12.

Figure 2:
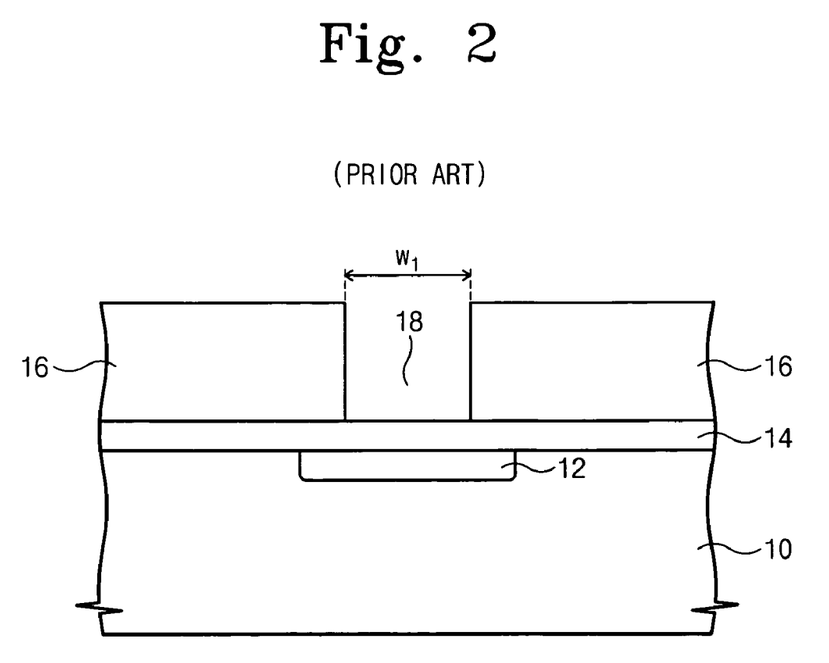

Next, referring to FIG. 2, after forming an interlayer insulating layer 16 on the oxide layer 14, the interlayer insulating layer 16 is patterned by a photolithography process to form an aperture 18 that limits a tunneling region. That is, after forming a photoresist layer that is a photosensitive layer on the interlayer insulating layer, the photoresist is exposed and developed by a previously prepared photo-mask to form a photoresist pattern having the aperture that limits the tunneling region. Subsequently, the interlayer insulating layer exposed by the aperture of the photoresist pattern is dry etched to form the interlayer insulating layer 16 having the aperture 18. The aperture of the photoresist pattern is directly transferred to the interlayer insulating layer. The width $w_1$ of the aperture 18 of the interlayer insulating layer 16 is dependent on the resolution of the photolithography process.

Figure 3:
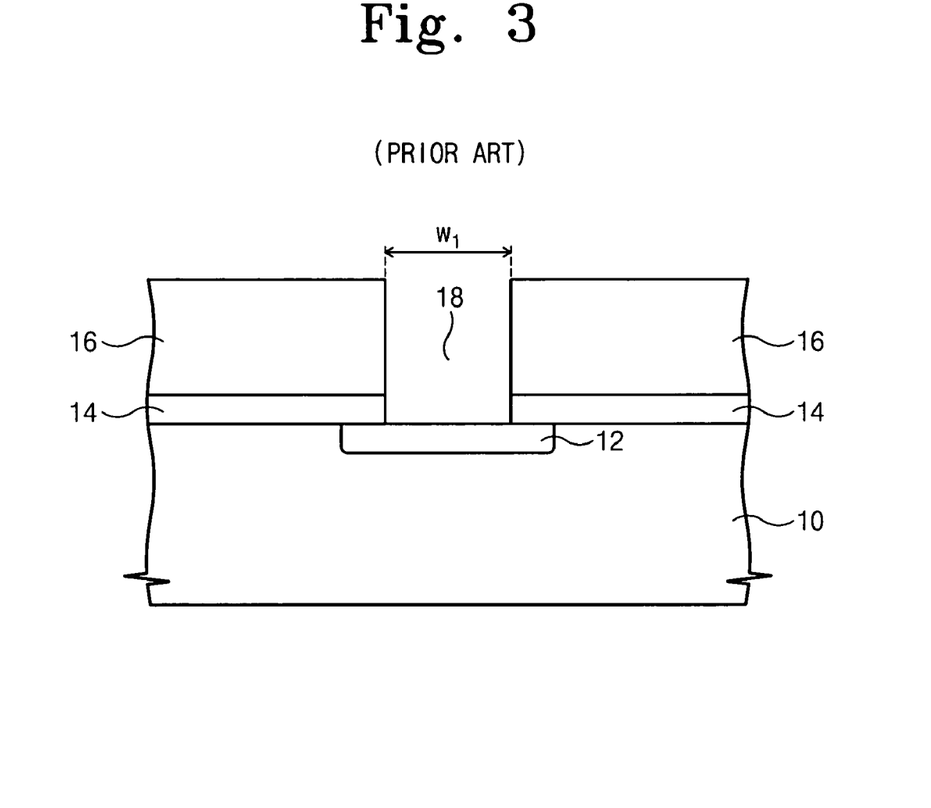

Next, referring to FIG. 3, the oxide layer 14 exposed by the aperture 18 is wet etched to expose the impurity diffusion region 12.

Figure 4:
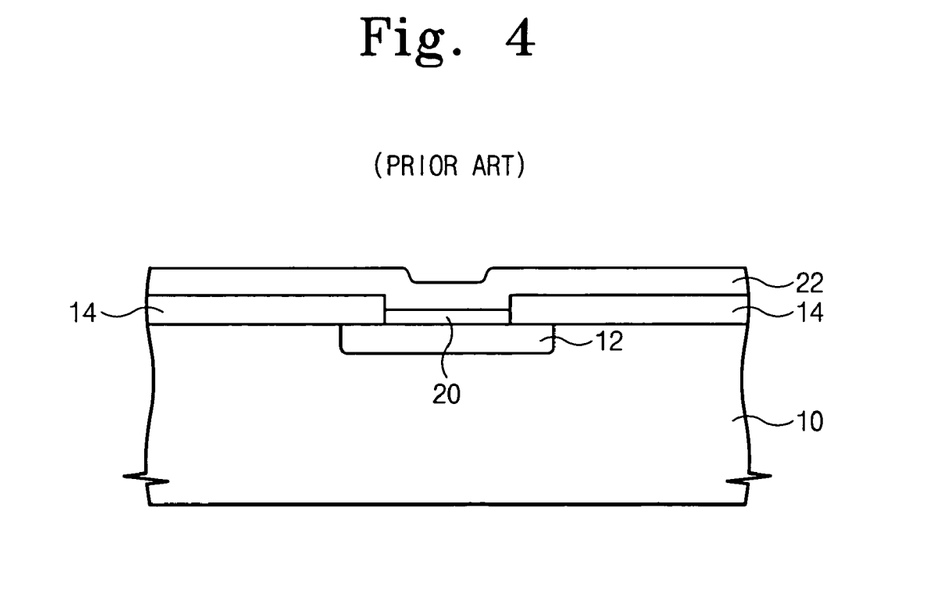

Next, referring to FIG. 4, after forming a tunneling oxide film 20 on the impurity diffusion region 12 exposed by the aperture 18, polysilicon 22 for forming a floating gate is formed.

According to the conventional method of forming the EEPROM device, it is difficult to reduce the area of the tunneling region 20 due to the limitation on the resolution of the photolithography process.

Therefore, a need exists for a method of forming an EEPROM device using a photolithography process and with reduction in the area of the tunneling region.

SUMMARY OF THE INVENTION

Some embodiments of the present invention provide a method of forming a tunneling insulating layer in an EEPROM device. The method comprises forming a first insulating layer on a substrate, forming a re-flowable material layer pattern having an aperture of first width that limits a tunneling region on the first insulating layer, re-flowing the re-flowable material layer pattern having the aperture of the first width to form a re-flown material layer pattern having an aperture of second width smaller than the first width, removing the first insulating layer exposed by the re-flown material layer pattern having the aperture of the second width to expose the substrate, and forming a tunneling insulating layer on the exposed substrate.

Preferably, the re-flown material layer pattern having the aperture of the second width is made smaller than the first width by re-flowing the re-flowable material layer pattern having the aperture of the first width. Since the area of the tunneling region is dependent on the re-flown material layer pattern having the aperture of the second width, the size of the tunneling region is reduced.

The re-flowable material layer pattern comprises photoresist, impurity doped silicate glass, and silicon-on-glass (SOG). A re-flowable material layer refers to an arbitrary material layer that becomes flexible by a thermal treatment process. The impurity doped silicate glass includes, but is not limited to, boron doped silicate glass (BSG), phosphorus doped silicate glass (PSG), and boron and phosphorus doped silicate glass (BPSG).

For example, when photoresist is used for forming the re-flowable material layer pattern, a photoresist layer is formed on the first insulating layer by a method such as spin coating and then, the photoresist layer is exposed and developed by a photo-mask to form the re-flowable material layer pattern having the aperture of the first width.

On the other hand, when the impurity doped silicate glass is used for forming the material layer pattern, an impurity doped silicate glass layer is formed on the first insulating layer, a photo-resist layer is formed, the photoresist layer is exposed and developed by the photo-mask to form a photoresist layer pattern, the doped silicate glass layer under the photoresist layer pattern is etched using the photoresist layer pattern as an etching mask, and the photoresist layer pattern is removed to form the reflowable material layer pattern having the aperture of the first width.

According to the above-described method, a process of re-flowing the re-flowable material layer pattern having the aperture of the first width may be performed at a temperature of about 50 to 250° C. It is apparent to those who skilled in the art that the thermal treatment for the re-flowing process may vary with various kinds of the re-flowable material layer patterns.

An EEPROM cannot operate reliably without good interface characteristics between the tunneling insulating layer and the substrate. Therefore, according to an embodiment of the present invention, the first insulating layer exposed by the re-flown material layer pattern having the aperture of the second width is removed to expose the substrate by performing wet etching, or sequential dry etching and wet etching. When the sequential dry etching and wet etching are performed, after removing a partial thickness of the first insulating layer exposed by the re-flown material layer pattern having the aperture of the second width by performing dry etching, the first insulating layer that resides under the aperture of the second width is removed by performing wet etching.

It is preferable that a partial thickness of the first insulating layer residing under the aperture of the second width be etched by performing dry etching such that the surface of the substrate is not affected by the damage caused by dry etching. Also, the first insulating layer that resides after performing dry etching should be as thin as possible. This enables minimizing the degree of etching in a side direction when a wet etching process is performed, since a side direction as well as a lower direction is affected by wet etching.

Since the width of the interface in which the re-flowable material layer pattern having the aperture of the second width and the first insulating layer contact each other may be larger than the width of other portions, it is preferable that dry etching be performed prior to wet etching.

A second insulating layer having etching selectivity with respect to the first insulating layer may be further formed on the first insulating layer. For example, the first insulating layer may be formed of a silicon oxide layer. The second insulating layer may be formed of a silicon nitride layer or a multi-layer obtained by sequentially laminating the silicon nitride layer and a silicon oxynitride layer. In one such embodiment, first, the second insulating layer is removed by performing dry etching and then, the first insulating layer is removed by performing wet etching or sequential dry etching and wet etching.

According to the above-described method, the impurity diffusion region formed in the substrate under the tunneling insulating layer may be formed by various methods.

For example, the impurity diffusion region may be formed before forming the first insulating layer or after forming the first insulating layer.

When the impurity diffusion region is formed before forming the first insulating layer, the method of forming the tunneling insulating layer comprises forming a buffer insulating layer on the substrate, forming an etching mask having an aperture that limits the impurity diffusion region on the buffer insulating layer, implanting impurity ions through the aperture and then, performing the thermal treatment process to form the impurity diffusion region in the substrate, and removing the etching mask and the buffer insulating layer. The buffer insulating layer may reside without being removed. In such a case, the first insulating layer is not formed and the buffer insulating layer replaces the first insulating layer. The buffer insulating layer may be formed of a thermal oxide film.

When the impurity diffusion region is formed after forming the first insulating layer, the method of forming the tunneling insulating layer comprises forming an etching mask that limits the impurity diffusion region on the first insulating layer, implanting impurity ions and then, performing the thermal treatment process to form the impurity diffusion region on the substrate, and removing the etching mask.

Also, the impurity ion implanting process for the impurity diffusion region may be performed before re-flowing the re-flowable material layer pattern having the aperture of the first width. In such a case, the implanted impurity ions are diffused in the thermal treatment process for re-flowing the re-flowable material layer pattern having the aperture of the first width to form the impurity diffusion region.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Hereinafter, the embodiments of the present invention will be described in detail with reference to the attached drawings. In the drawings, the thickness of layers and regions are exaggerated for clarity. It will also be understood that when a layer is referred to as being on another layer or substrate, it can be directly on the other layer or substrate, or intervening layers may also be present. Also, in the various embodiments of the present specification, the terms first and second are used to describe various regions and layers. However, these regions and layers should not be construed as being limited to such terms. The terms are used for distinguishing a predetermined region or layer from another region or layer. Therefore, a layer referred to as a first layer in an embodiment may be referred to as a second layer in another embodiment.

Each of unit memory cells that constitute an EEPROM device includes a memory transistor and a selection transistor. The memory transistor includes the tunneling insulating layer, the floating gate, the intergate insulating layer, and the control gate.

Figure 5A:
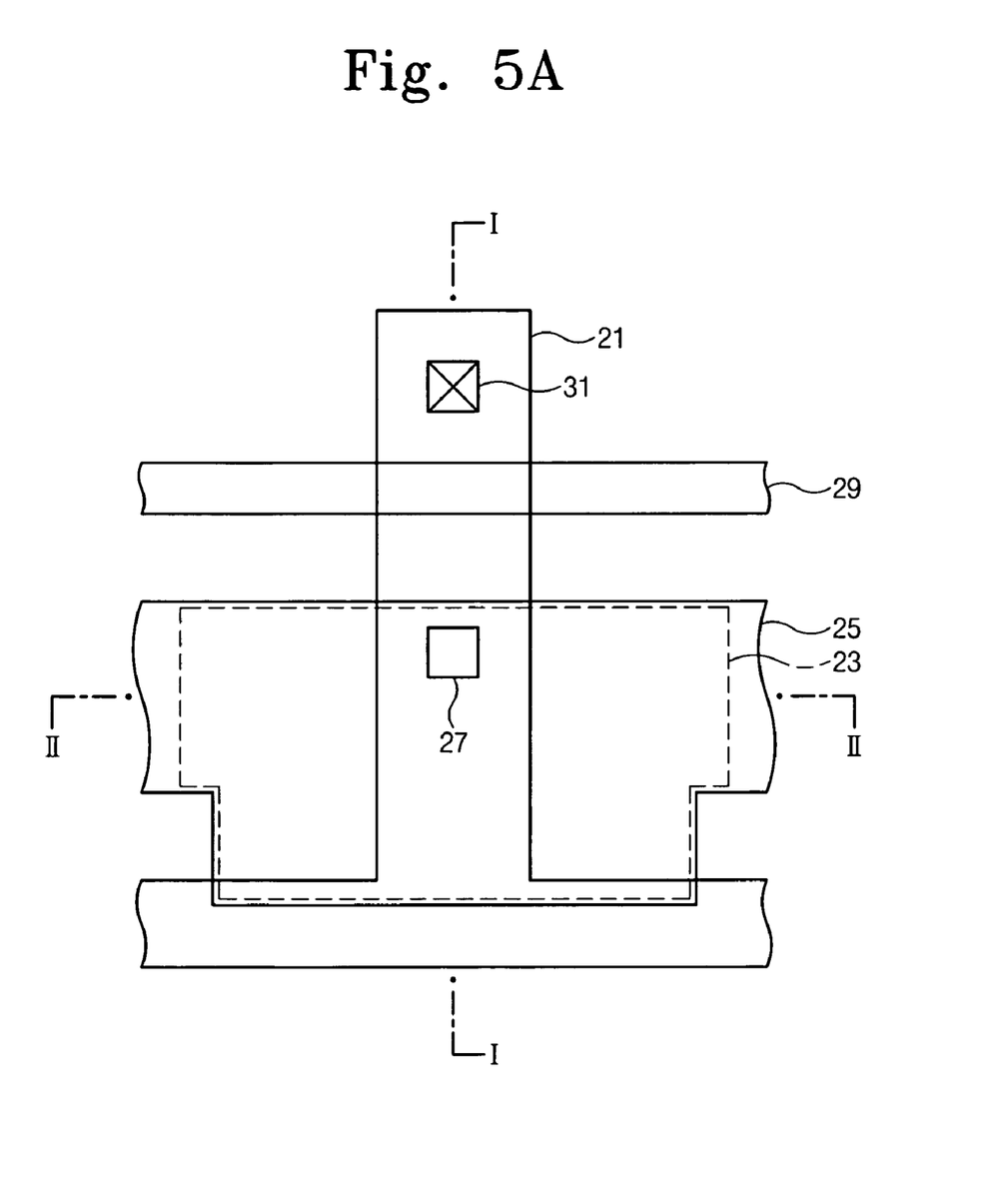
FIG. 5A is a plan view schematically illustrating an EEPROM device according to an embodiment of the present invention and FIGS. 5B and 5C are sectional views of a semiconductor substrate taken along the lines I-I and II-II of FIG. 5A.
Figure 5B:
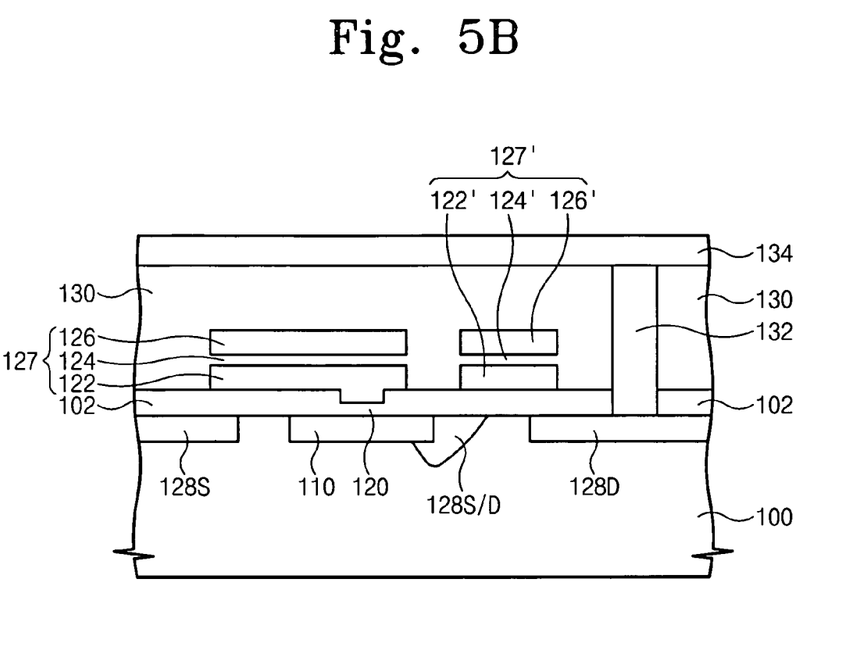
Figure 5C:
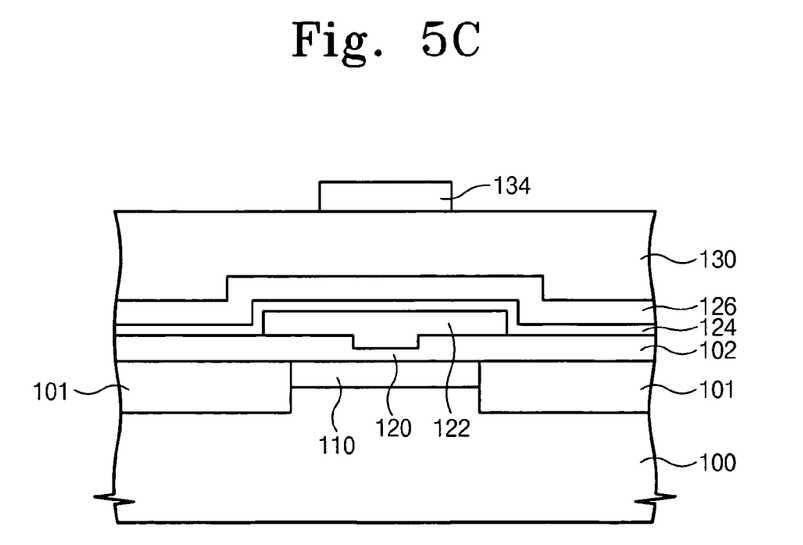

FIG. 5A is a plan view schematically illustrating a unit memory cell of the EEPROM device according to an embodiment of the present invention. FIGS. 5A and 5C are sectional views of a semiconductor substrate taken along the lines I-I and II-II of FIG. 5A, respectively.

It is apparent to those skilled in the art that duplicates of such memory cell are arranged in row and column directions.

In FIG. 5A, reference numerals 21, 23, 25, 27, 29, and 31 denote an active region, a floating gate, a control gate, a tunneling region, a word line of a selection transistor, and a bit line contact, respectively.

Referring to FIGS. 5B and 5C, the memory transistor includes a laminated gate structure 127 insulated from a substrate 100 by an insulating layer 102. The laminated gate structure 127 includes a floating gate 122 and a control gate 126 laminated on the semiconductor substrate 100 with an intergate insulating layer 124 interposed. A common source region 128S is positioned in the semiconductor substrate 100 in one side of the laminated gate structure 127. An impurity diffusion region 110 is positioned in the semiconductor substrate 100 under a predetermined region of the floating gate 122. A thin tunneling insulating layer 120 is positioned between the predetermined region of the floating gate 122 and the impurity diffusion region 110. Charges are injected from the impurity diffusion region 110 to the floating gate 122 or are discharged from the floating gate 122 to the impurity diffusion region 110 through the tunneling insulating layer 120.

A selection transistor including a source/drain region 128S/D, a drain region 128D, and a laminated selection gate structure 127' is positioned in the other side of the laminated gate structure 127 of the memory transistor. The laminated selection gate structure 127' of the selection transistor is positioned on the semiconductor substrate 100 with the insulating layer 102 interposed and is positioned between the source/drain region 128S/D and the drain region 128D. The source/drain region 128S/D is adjacent to the impurity diffusion region 110. Although not shown in the drawings, a contact for applying a voltage to a lower gate 122' of the laminated gate structure 127' is formed and the lower gate 122' of the laminated gate structure 127' operates as a word line of the selection transistor. A bit line 134 is electrically connected to the drain region 128D through a contact plug 132.

The operation of the EEPROM device will be described. During an erasing operation, a high erasing voltage of about 15 to about 50 volts is applied to the control gate 122 and the word line 122', a voltage of 0 volts is applied to the bit line 134, the common source region 128S is floated or a voltage of 0 volts is applied to the common source region 128S. Therefore, charges are implanted from the impurity diffusion region 110 to the floating gate 122 through the tunneling insulating layer 120 such that a threshold voltage of the memory transistor increases.

During a programming operation, a voltage of 0 volts is applied to the control gate 122, a high programming voltage of about 15 to about 20 volts is applied to the bit line 134 and the word line 122', and the common source region 128S is floated. Therefore, the charges stored in the floating gate 122 are discharged through the tunneling insulating layer 120 to reduce the threshold voltage of the memory transistor.

During a reading operation, a voltage of about 0.5 to about 2 volts is applied to the bit line 134, a Vcc voltage of about 1.6 to about 5.5 volts is applied to the word line 122', a voltage of about 1.0 to about 2.0 volts is applied to the control gate 126, and a voltage of 0 volts is applied to the common source 128S. Change in the magnitude of the threshold voltage of the memory transistor determines whether a current channel is to be formed from the common source 128S of the memory transistor to the drain region 128D of the selection transistor or not. The amount of current is sensed to determine the information (whether the information is logic '0' or logic '1') stored in the memory transistor.

Hereinafter, a method of forming a tunneling insulating layer in the EEPROM device according to an embodiment of the present invention will be described.

Figure 6:
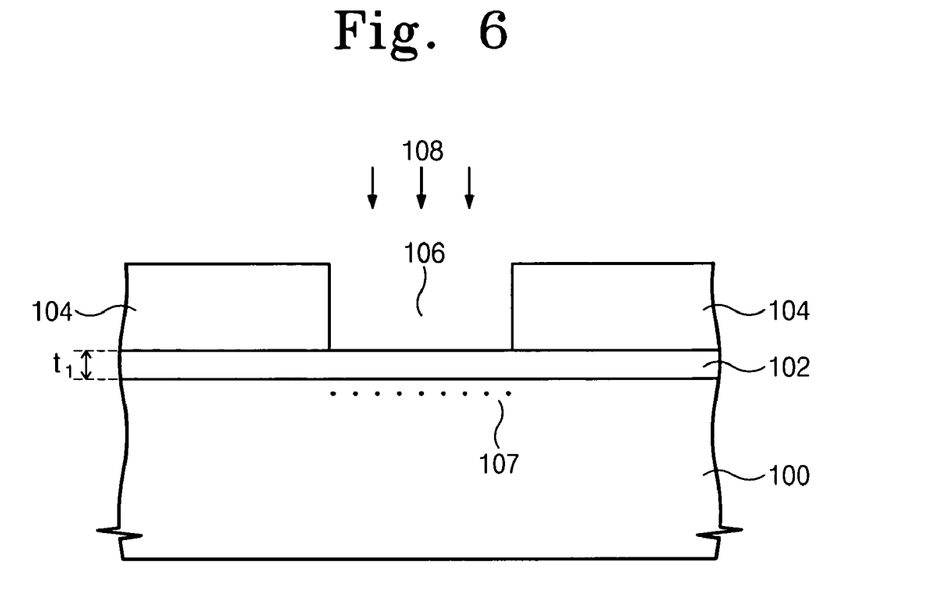
FIGS. 6 to 9 are sectional views of a semiconductor substrate illustrating a method of forming a tunneling insulating layer in an EEPROM device according to an embodiment of the present invention.

FIG. 6 is a sectional view of a semiconductor substrate illustrating mask processes of forming the impurity diffusion region. The first insulating layer 102 is formed on the semiconductor substrate 100. The first insulating layer 102 may be formed of a thermal oxide layer or a chemical vapor deposition oxide layer. An ion-implantation mask 104 in which an aperture 106 that limits the impurity diffusion region is formed on the first insulating layer 102. An impurity ion implanting process for implanting impurity ions 108 into the semiconductor substrate 100 through the first insulating layer 102 exposed by the aperture 106 of the ion implantation mask 104 is performed.

Figure 7:
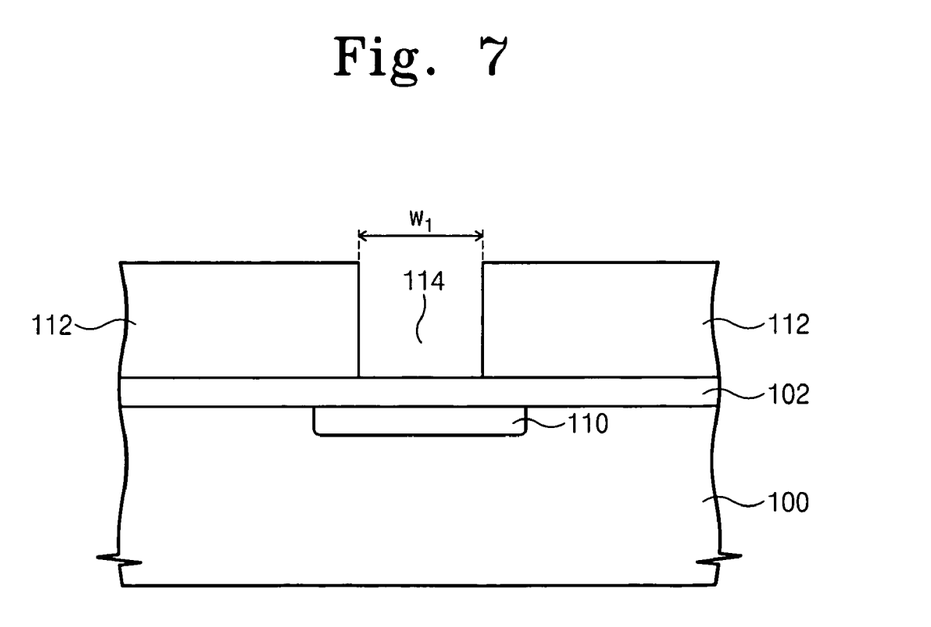

Subsequently, a thermal treatment process is performed to activate the impurity ions 107 implanted into the semiconductor substrate such that the impurity diffusion region 110 is formed as illustrated in FIG. 7. After removing the ion implantation mask 104, a re-flowable material layer pattern 112 having a first aperture 114 that limits a region in which the tunneling insulating layer is to be formed (the tunneling region) is formed on the first insulating layer 102. The first aperture 114 has first width $w_1$, which is dependent on the resolution of the photolithography process. Any layer that becomes flexible by thermal treatment may be used as the re-flowable material layer pattern 112. Such a re-flowable material layer pattern comprises photoresist, impurity doped silicate glass, and a silicon-on-glass (SOG) layer.

For example, when photoresist is used, the re-flowable material layer pattern 112 is formed by the following processes. First, after forming a photoresist layer on the first insulating layer 102 using a method such as spin coating, the photoresist layer is exposed and developed using a photomask (not shown) such that a re-flowable photoresist pattern is formed.

On the other hand, when the impurity doped silicate glass or the SOG layer is used, the re-flowable material pattern 112 can be formed by the following processes. First, after forming the impurity doped silicate glass layer or the SOG layer on the first insulating layer 102, the photoresist layer is formed. Subsequently, the photoresist layer is exposed and developed using the photo-mask such that the photoresist pattern that limits the tunneling region is formed. Subsequently, the impurity doped silicate glass layer or the SOG layer that is an under layer exposed by the photoresist pattern is etched. Subsequently, the photoresist pattern is removed. At this time, an etching mask layer such as a silicon nitride layer may be further formed between the impurity doped silicate glass layer or the SOG layer and the photoresist layer.

It is preferable that the re-flowable material layer pattern 112 be formed of photoresist. In such a case, since it is not necessary to form and etch additional layer, it is possible to simplify processes and to reduce fabrication cost.

Figure 8:
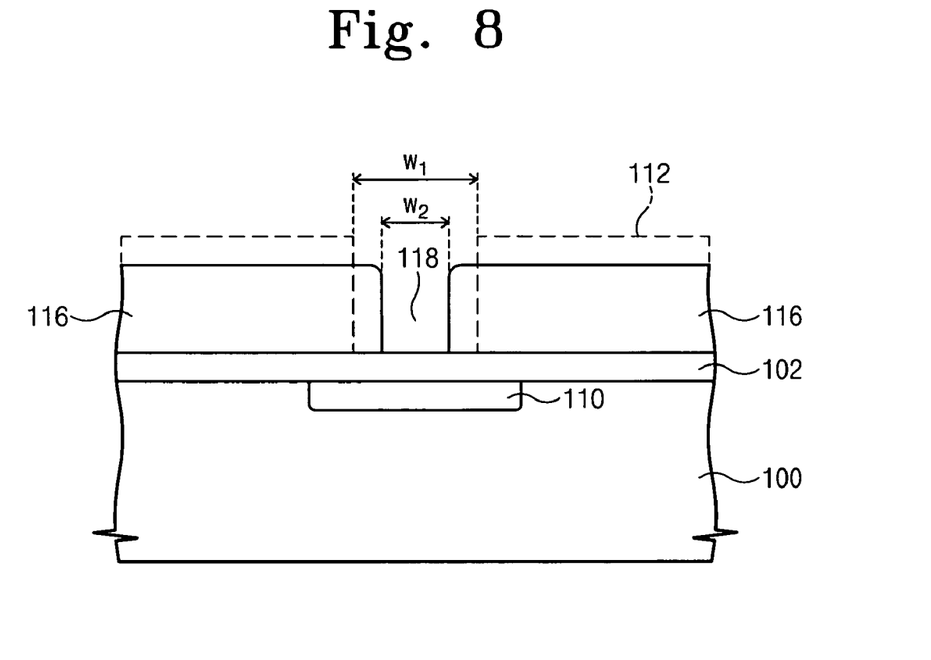

Next, the thermal treatment process is performed to re-flow the re-flowable material layer pattern 112 having the aperture 114 of the first width such that the material layer pattern 112 is flexible. Therefore, a re-flown material layer pattern 116 having an aperture 118 of second width $w_2$ that is smaller than the first width $w_1$ is formed as illustrated in FIG. 8. The first width $w_1$ is the minimum aperture that can be obtained by the photolithography process. According to the embodiments of the present invention, it is possible to obtain a smaller aperture than the first width $w_1$.

Next, the first insulating layer 102 exposed by the aperture 118 of the second width is removed such that the impurity diffusion region 110 of the semiconductor substrate 100 is exposed and then, the tunneling insulating layer 120 is formed. The tunneling insulating layer 120 may be formed of a multi-layer obtained by sequentially laminating a silicon oxide layer or a silicon nitride layer and the silicon oxide layer. The tunneling insulating layer 120 is preferably formed by a thermal oxidation process. When the thermal oxidation process is performed at an oxygen atmosphere, the tunneling insulating layer made of the silicon oxide layer is obtained. On the other hand, after performing the thermal oxidation process at the oxygen atmosphere to form a thermal oxide film, thermal treatment is continuously performed in a state where an oxygen source is removed and a nitrogen source is provided, nitrogen permeates into the interface between the substrate and the thermal oxide layer such that a silicon oxynitride layer is formed in the interface. As a result, a tunneling insulating layer formed of a double layer in which the silicon oxynitride layer and the silicon oxide layer are laminated is obtained.

Here, the first insulating layer exposed by the aperture 118 of the second width is removed by performing wet etching or by sequentially performing dry etching and wet etching. When the first insulating layer is removed by sequentially performing dry etching and wet etching, most of the first insulating layer is removed by performing dry etching and then, the remaining first insulating layer is removed by performing wet etching. Here, the first insulating layer preferably remains such that the semiconductor substrate is not damaged by dry etching.

Figure 9:
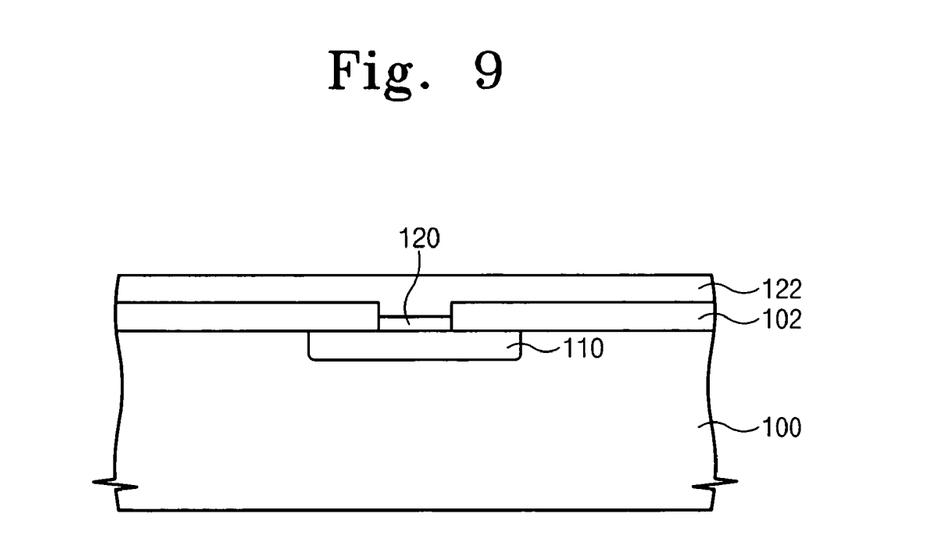

Next, referring to FIG. 9, a first conductive layer 122 for the floating gate of the memory transistor and the word line of the selection transistor is formed on the entire substrate. Then, common processes are performed to complete the memory transistor and the selection transistor.

Figure 10:
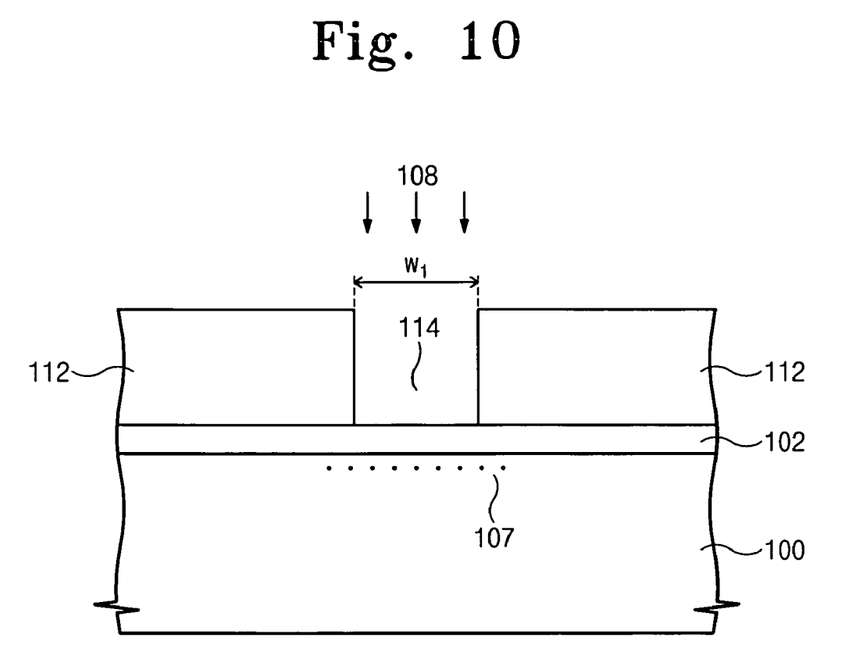
FIGS. 10 to 11 are sectional views of a semiconductor substrate illustrating a method of forming a tunneling insulating layer in an EEPROM device according to another embodiment of the present invention.

The impurity diffusion region 110 may be formed after forming the re-flowable material layer pattern 112. In this case, an additional photolithograph process for the impurity diffusion region 110 is not performed (as the ion implantation mask 104 of FIG. 6 is not necessary). Then, referring to FIG. 10, after forming the first insulating layer 102 on the semiconductor substrate 100, the re-flowable material layer pattern 112 having the aperture 114 of the first width $w_1$ that limits the tunneling region is formed. Subsequently, the impurity ions 107 are implanted into the semiconductor substrate 100 through the first insulating layer 102 exposed by the aperture 114 of the first width.

Figure 11:
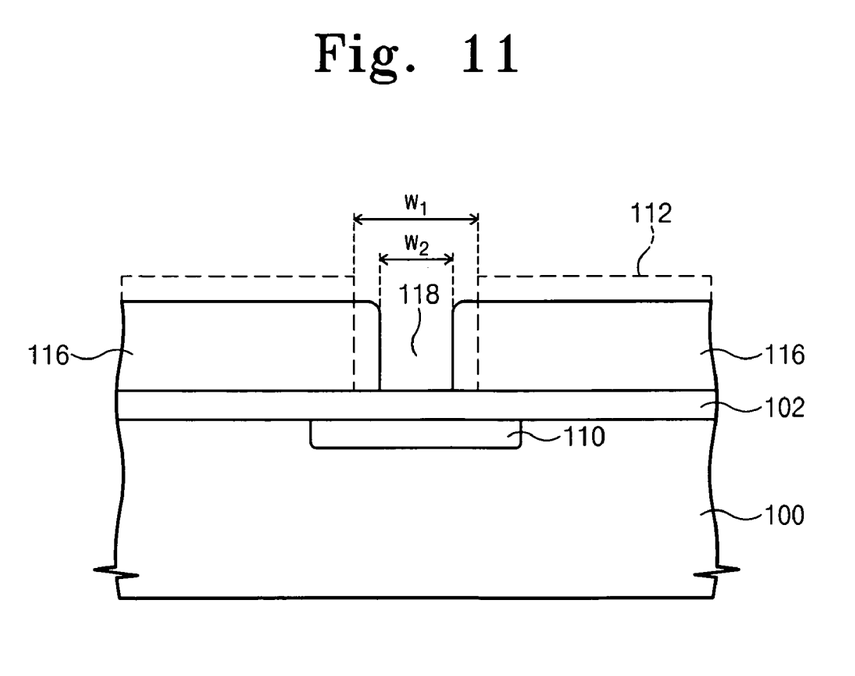

Next, referring to FIG. 11, the thermal treatment process is performed to re-flow the re-flowable material layer pattern 112 such that the re-flown material layer pattern 116 having the aperture 118 of the second width $w_2$ is formed and, at the same time, the implanted impurity ions 108 are activated to form the impurity diffusion region 110. In a subsequent process, after removing the exposed first insulating layer 102, the tunneling insulating layer is formed.

Before forming the re-flowable material layer pattern 112 in FIG. 7, the first insulating layer 102 used as a buffer layer during the ion implanting process for the impurity diffusion region may be removed such that a new insulating layer is formed. Also, in such a case, when the thickness of the newly formed insulating layer is large, a part of the new insulating layer may be used as the tunneling insulating layer.

Figure 12:
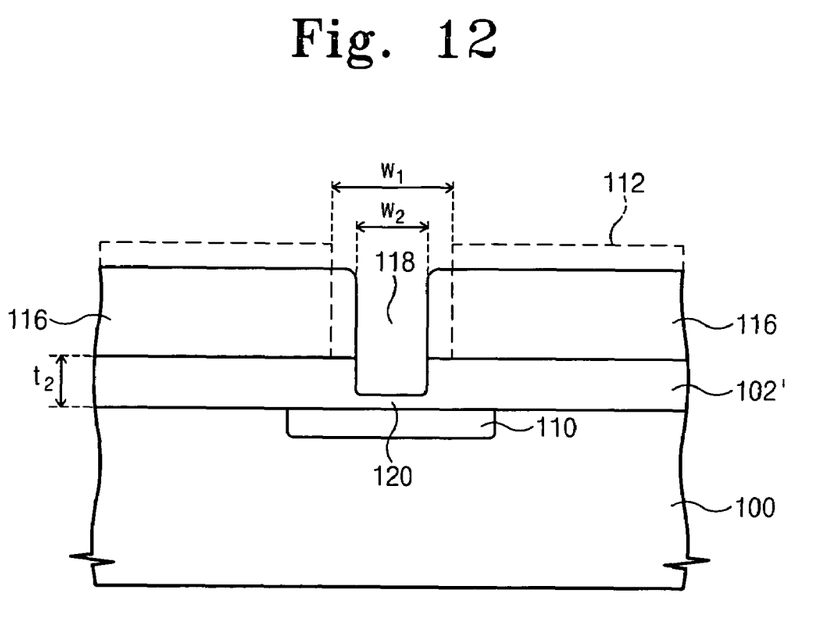
FIG. 12 is a sectional view of a semiconductor substrate illustrating a method of forming a tunneling insulating layer in an EEPROM device according to still another embodiment of the present invention.

Referring to FIG. 12, like in the method described with reference to FIG. 6, after forming the impurity diffusion region 110 in the semiconductor substrate 100, the ion implantation mask 104 and the first insulating layer 102 are removed. Subsequently, a thick insulating layer 102' is formed on the substrate 100 including the impurity diffusion region 110. Next, after forming the re-flowable material layer pattern 112, the thermal treatment process is performed to form the re-flown material layer pattern 116 having the aperture 118 of the second width $w_2$. Next, partial thickness of the thick insulating layer 102' exposed to the aperture 118 is removed such that predetermined thickness remains to form the tunneling insulating layer 120. At this time, the part of the insulating layer 102' is removed by performing wet etching or by sequentially performing dry etching and wet etching.

Next, after removing the re-flown material layer pattern 116, the first conductive layer 122 for the floating gate of the memory transistor and the word line of the selection transistor is formed on the entire substrate. Then, common processes are performed to complete the memory transistor and the selection transistor.

According to another present embodiment, a second insulating layer 103 is further formed on the first insulating layer 102, in the embodiment described with reference to FIGS. 6 to 9.

Figure 13:
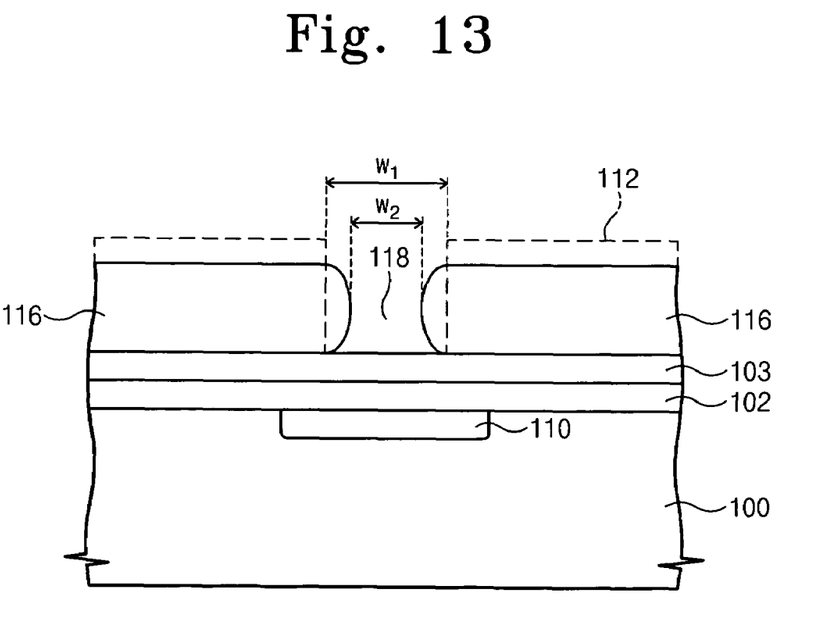
FIGS. 13 to 15 are sectional views of a semiconductor substrate illustrating a method of forming a tunneling insulating layer in an EEPROM device according to still another embodiment of the present invention.

Referring to FIG. 13, after forming the impurity diffusion region 110, the second insulating layer 103 is formed on the first insulating layer 102. The second insulating layer 103 is formed of a layer having etching selectivity with respect to the first insulating layer 102. For example, the second insulating layer 103 may be formed of the silicon nitride layer or the multi-layer obtained by sequentially laminating the silicon nitride layer and the silicon oxynitride layer.

Subsequently, referring to FIG. 13, after forming the re-flowable material layer pattern 112 on the second insulating layer 103, the thermal treatment process is performed to form the re-flown material layer pattern 116.

Figure 14:
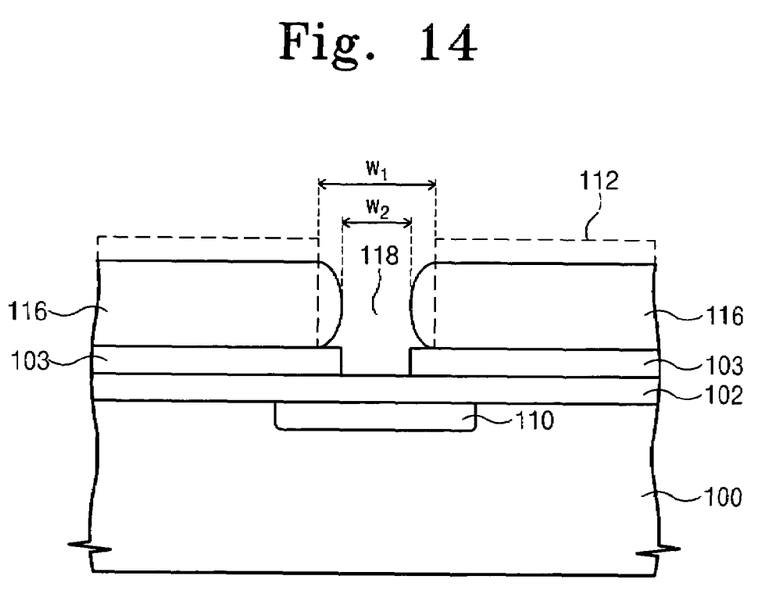

Next, referring to FIG. 14, the exposed second insulating layer 103 is removed by performing dry etching to expose the first insulating layer 102. A part of the first insulating layer 102 may be etched due to over-etching.

Figure 15:
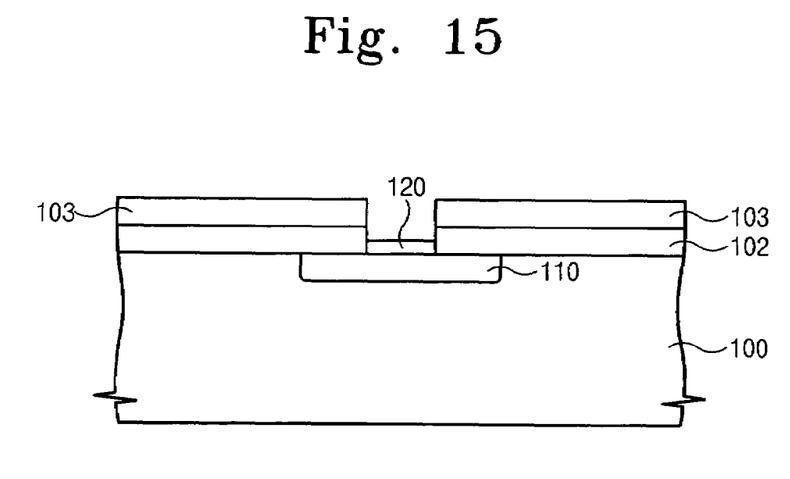

Next, referring to FIG. 15, the exposed first insulating layer is removed by performing wet etching to expose the impurity diffusion region 110 and then, the re-flown material layer pattern 116 is removed and the tunneling insulating layer 120 is formed.

Subsequently, common processes are performed to complete the memory transistor and the selection transistor.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming a tunneling insulating layer of an electrically erasable and programmable memory device, the method comprising:
    forming a first insulating layer on a substrate;
    forming a re-flowable material layer pattern having an aperture of a first width on the first insulating layer;
    implanting impurity ions into the substrate through the aperture of the first width;
    re-flowing the re-flowable material layer pattern to form a re-flown material layer pattern having an aperture of a second width that is smaller than the first width;
    removing the first insulating layer that has been exposed by the re-flown material layer pattern having the aperture of the second width to expose the substrate; and
    forming a tunneling insulating layer on the exposed substrate and,
    wherein, when the re-flowable material layer pattern having the aperture of the first width is re-flown, the impurity ions implanted into the substrate are diffused to form an impurity diffusion region.

2. The method as set forth in claim 1, wherein the re-flowable material layer pattern comprises a photoresist or an impurity doped silicate glass layer.

3. The method as set forth in claim 1, wherein removing the first insulating layer exposed by the re-flown material layer pattern having the aperture of the second width to expose the substrate comprises:
   removing a partial thickness of the first insulating layer exposed by the re-flown material layer pattern having the aperture of the second width by performing dry etching; and
   removing the first insulating layer that remains under the aperture of the second width by performing wet etching.

4. The method as set forth in claim 1,
   wherein, removing the first insulating layer that has been exposed by the re-flown material pattern having the aperture of the second width to expose the substrate comprises exposing the impurity diffusion region formed in the substrate.

5. A method of forming a tunneling insulating layer of an electrically erasable and programmable memory device, the method comprising:
   forming a first insulating layer on a substrate;
   forming a second insulating layer on the first insulating layer;
   forming a re-flowable material layer pattern having an aperture of a first width on the second insulating layer;
   implanting impurity ions into the substrate through the aperture of the first width;
   re-flowing the re-flowable material layer pattern to form a re-flown material layer pattern having an aperture of a second width that is smaller than the first width;
   removing the second and first insulating layers that have been exposed by the re-flown material layer pattern having the aperture of the second width to expose the substrate; and
   forming a tunneling insulating layer on the exposed substrate, wherein, when the re-flowable material layer pattern having the aperture of the first width is re-flown, the impurity ions implanted into the substrate are diffused to form an impurity diffusion region.

6. The method of claim 5, wherein, removing the second and first insulating layers that have been exposed by the re-flown material layer pattern having the aperture of the second width to expose the substrate comprises:
   dry etching the second insulating layer that has been exposed by the re-flown material layer pattern having the aperture of the second width to expose the first insulating layer under the second insulating layer;
   removing the re-flown material layer pattern having the aperture of the second width; and
   wet etching the exposed first insulating layer.

7. The method of claim 6, wherein removing the first insulating layer that has been exposed by the re-flown material pattern having the aperture of the second width to expose the substrate comprises exposing the impurity diffusion region formed in the substrate.

* * * * *